United States Patent
Yap et al.

(10) Patent No.: US 12,149,244 B2
(45) Date of Patent: *Nov. 19, 2024

(54) CONFIGURATION LATCH FOR PROGRAMMABLE LOGIC DEVICE

(71) Applicant: QuickLogic Corporation, San Jose, CA (US)

(72) Inventors: Ket Chong Yap, San Jose, CA (US); Chihhung Liao, Fremont, CA (US)

(73) Assignee: QuickLogic Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/504,072

(22) Filed: Nov. 7, 2023

(65) Prior Publication Data

US 2024/0171178 A1 May 23, 2024

Related U.S. Application Data

(63) Continuation of application No. 17/697,856, filed on Mar. 17, 2022, now Pat. No. 11,848,671.

(51) Int. Cl.
*G11C 11/419* (2006.01)
*H03K 19/1776* (2020.01)
*H03K 19/20* (2006.01)

(52) U.S. Cl.
CPC ........ *H03K 19/1776* (2013.01); *G11C 11/419* (2013.01); *H03K 19/20* (2013.01)

(58) Field of Classification Search
CPC ..... G11C 7/1039; G11C 7/106; G11C 7/1087; G11C 29/789; G11C 11/41; G11C 11/419; H03K 19/1776; H03K 19/20
See application file for complete search history.

(56) References Cited

U.S. PATENT DOCUMENTS

2015/0070962 A1*  3/2015  Ohmaru .............. H01L 27/1225
                                                    365/72

* cited by examiner

*Primary Examiner* — Alfredo Bermudez Lozada
(74) *Attorney, Agent, or Firm* — Seed IP Law Group LLP

(57) ABSTRACT

An area efficient readable and resettable configuration memory latch maintains latch data integrity through read and write operations and includes a non-terminated inout bit line (BL). During write operations, enabled by a Word Line Write (WLW) signal, the non-terminated inout BL drives data to be written, while, during read operations, enabled by a Word Line Read (WLR) signal, the state of the BL is indicative of a data stored in the latch. A pull-down network is activated when the WLR signal is asserted and the stored data is logic one and, when activated, operates to pull down the BL to logic zero; the pull-down network is inactive otherwise. A weak pull-up operates to pull up the BL when the pull-down network is inactive. A sensing block is configured to sense the state of the BL when the WLR signal and a read enable signal are both asserted.

20 Claims, 5 Drawing Sheets

CONFIGURATION LATCH FOR PROGRAMMABLE LOGIC DEVICE

TECHNICAL FIELD

The present invention relates to an integrated circuit that includes a programmable logic device (PLD), such as a field programmable gate array (FPGA) and to a programmable configuration latch for PLDs.

BACKGROUND

The semiconductor industry is driven by a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of only one customer.

Programmable logic devices, such as field programmable gate arrays (FPGAs), are versatile integrated circuit chips, which have internal circuitry logic with user selected connections that a user can configure to realize user-specific functions. While programmable logic is versatile, there can be significant design challenges related to incorporating desired logic for a specified die size, routing signals, signal stability, etc. when large complex functions are mapped onto a silicon platform that includes programmable logic.

For example, FPGAs may use storage elements when routing through multiplexers ("muxes") or when defining a function via a look up table. Conventionally, the storage elements used are Static Random Access Memory (SRAM) cells, or registers. SRAM cells may be distributed throughout the design and may take the form of an array. SRAM cells may be used to program FPGA routing interconnects and configurable logic blocks (CLBs) that are used to implement logic functions. While SRAM cells can be area-efficient, they are very foundry and process dependent and can cause considerable difficulties when migrating the FPGA product to a different process or a different foundry. On the other hand, while registers are available and can be implemented using standard cell libraries—they are not area efficient.

Conventionally, latches, which are much more area-efficient relative to registers, are not used as storage elements, in part, because of difficulties that can arise with the reading of latches.

Some disclosed embodiments enable the use of latches as storage elements thereby facilitating standardized area-efficient FPGA design.

SUMMARY

Some disclosed embodiments pertain to a configuration memory latch circuit comprising: a word line write (WLW) signal to enable data to be written into the configuration memory latch; a word line read (WLR) signal to enable data to be read from the configuration memory latch; a non-terminated bit line (BL) to input a first data to be written into the configuration memory latch during write operations, and wherein a state of the BL, during read operations, is indicative of a second data stored in the configuration memory latch; a first transmission gate (TG) with input of the first TG coupled to the non-terminated BL, wherein the first TG is activated when the WLW signal is asserted and stores the first data; a second TG coupled to the output of the first TG, wherein the second TG is activated the WLW signal is de-asserted and outputs the second data; a NAND gate, wherein the input of the NAND gate is coupled to the output of the first TG and to a reset line; a first inverter, wherein the input of the first inverter is coupled to the output of the NAND gate and the output of the first inverter is coupled to the output of the second TG; a pull-down network comprising a first nMOS transistor coupled in series to a second nMOS transistor, wherein the first nMOS transistor gate input is coupled to the WLR signal and the second nMOS transistor gate input is coupled to the output of the second TG and to the output of the first inverter, and wherein the first transistor drain is coupled to the non-terminated BL and the second nMOS transistor source is grounded; and a sensing block, wherein the input of the sensing block is coupled to a weak pull up coupled to the BL and to a read enable signal, wherein the sensing block is configured to sense the state of the BL when the WLR signal and the read enable signal are both asserted.

Some disclosed embodiments also pertain to an integrated circuit (IC) comprising: a programmable logic device (PLD). The PLD may comprise at least one configuration memory, wherein the at least one configuration memory may comprise a plurality of configuration memory latches. Further, at least one of the plurality of configuration memory latches may comprise: a word line write (WLW) signal to enable data to be written into the at least one configuration memory latch; a word line read (WLR) signal to enable data to be read from the at least one configuration memory latch; a non-terminated bit line (BL) that drives input of a first data to be written into the at least one configuration memory latch during write operations, and wherein a state of the BL, during read operations, is indicative of a second data stored in the at least one configuration memory latch; a first transmission gate (TG) with input of the first TG coupled to the non-terminated BL, wherein the first TG is activated when the WLW signal is asserted and stores the first data; a second TG coupled to the output of the first TG, wherein the second TG is activated the WLW signal is de-asserted and outputs the second data; a NAND gate, wherein the input of the NAND gate is coupled to the output of the first TG and to a reset line; a first inverter, wherein the input of the first inverter is coupled to the output of the NAND gate and the output of the first inverter is coupled to the output of the second TG; a pull-down network comprising a first nMOS transistor coupled in series to a second nMOS transistor, wherein the first nMOS transistor gate input (g1) is coupled to the WLR signal and the second nMOS transistor gate input (g2) is coupled to the output of the second TG and to the output of the second inverter, and wherein the first transistor drain is coupled to the non-terminated BL and the second nMOS transistor source is grounded; and a sensing block, wherein the input of the sensing block is coupled to a weak pull up coupled to the BL and to a read enable signal, wherein the sensing block is configured to sense the state of the BL when the WLR signal and the read enable signal are both asserted.

Disclosed embodiments also pertain to a configuration memory latch comprising: a word line write (WLW) signal, wherein the WLW signal is asserted to enable input first data on a non terminated bit line (BL) to be written into the configuration memory latch during write operations; a word line read (WLR) signal, wherein the WLR signal is asserted to enable second data stored in the configuration memory latch to be read, wherein assertion of the WLR signal does not overlap with assertion of the WLW signal, and wherein a state of the BL, during read operations, is indicative of the second data; a D-latch, wherein input of the D-latch is coupled to the BL, wherein the D-latch operates to store the first data when the WLW signal is asserted, and wherein the D-latch operates to output the stored second data when the WLW signal is de-asserted; a pull-down network coupled to the BL and to the D-latch, wherein the pull-down network is activated when the WLR signal is asserted and the stored second data is logic level 1, wherein the pull-down network is inactivated otherwise, and wherein the pull-down network operates to pull down the BL to logic level zero when activated; a weak pull-up coupled to the BL, wherein, the weak pull-up operates to pull up the BL when the pull-down network is inactive; and a sensing block, wherein a first input of the sensing block is coupled to the weak pull up and a second input of the sensing block is coupled to a read enable signal, wherein the sensing block is configured to sense the state of the BL when the WLR signal and the read enable signal are both asserted.

DETAILED DESCRIPTION

In the description, the terms "1", "one", "high", "logic 1", "logic one", and "logic high" refer to logic signal levels that are above some threshold voltage and sensed by logic circuitry to be a Boolean 1, whereas the terms "0", "zero", "low", "logic zero", "logic 0", "and "logic low" refer to logic signal levels that are below some threshold voltage and sensed by logic circuitry to be a Boolean 0. The term "asserted" refers to an activation of a signal (e.g., the signal is interpreted as being true without regard to the logic level of the signal in question), whereas the term "de-asserted" refers to an inactivation of a signal (e.g., the signal is interpreted as being false regardless of logic level of the signal in question).

Figure 1A:
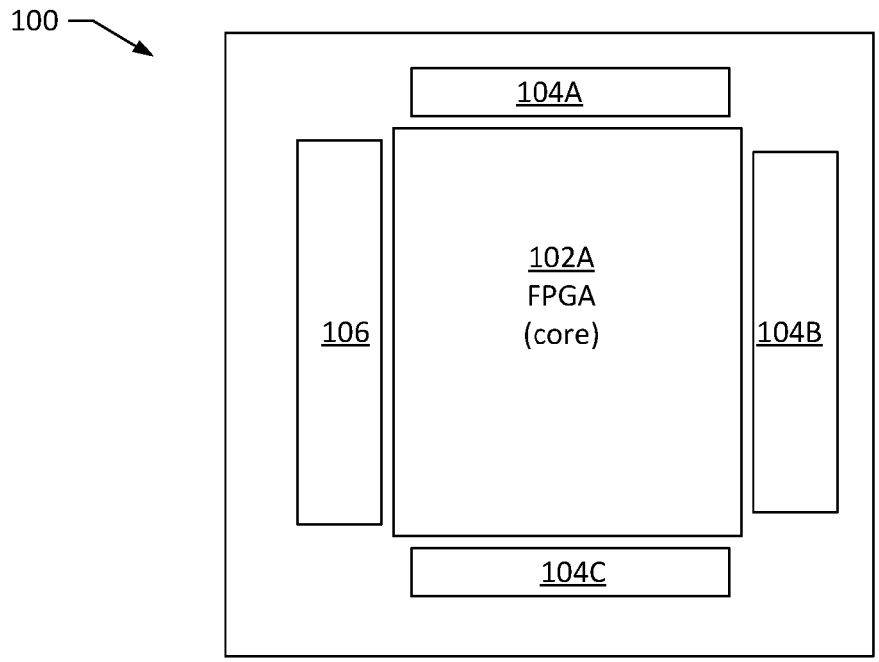
FIGS. 1A and 1B show a simplified schematic of a programmable logic device (PLD) such as a field programmable gate array (FPGA) or other circuitry having user programmable circuit connections.
Figure 1B:
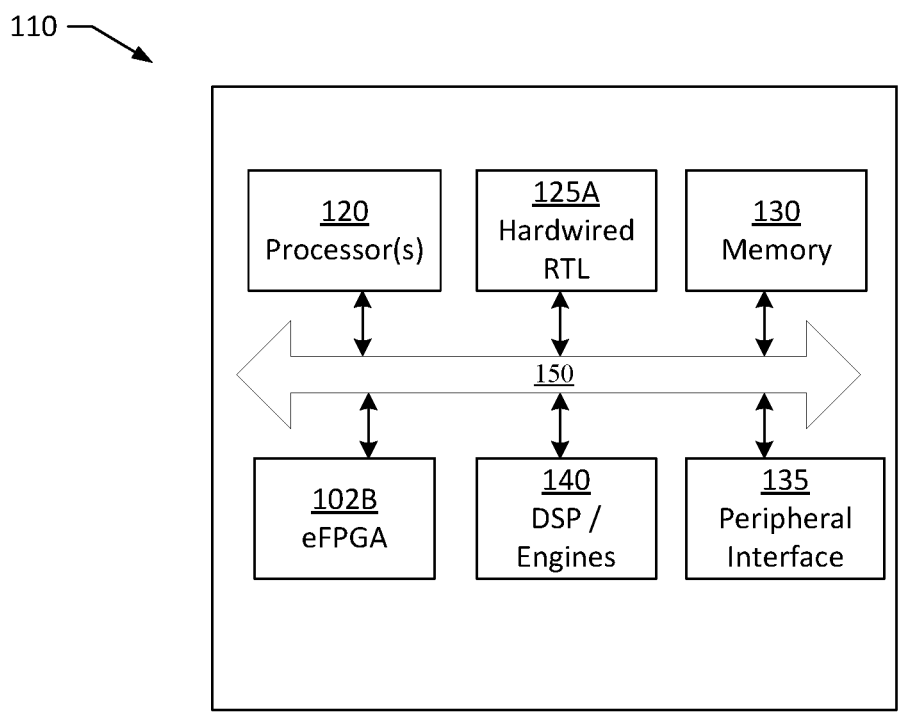

FIGS. 1A and 1B show simplified block diagrams of example Integrated Circuit (IC) chip 100 that may include programmable logic devices (PLD) 102 such as a field programmable gate array (FPGA) (e.g., 102A or 102B), and/or other circuitry having user programmable circuit connections. For simplicity and ease of description, the term "FPGA" may refer to any programmable logic device. Accordingly, while a programmable logic device described herein may be referred to as FPGA 102, it should be understood that other alternative types of programmable logic devices may also be used, such as Simple PLDs (SPLDs), Complex PLDs (CPLDs), Programmable Array Logic (PAL), etc.

As used herein, FPGA 102 may be a standalone FPGA 102A and/or take the form of an embedded FPGA (eFPGA) 102B. cFPGAs 102B may be viewed as fully integrated programmable logic Intellectual Property (IP) cores that form part of an ASIC or a System on a Chip (SoC). The term IP core refers to a reusable unit of logic, cell, circuit, or design element. IP cores are often licensed by an owning entity to another entity as a turnkey solution that provides some desired functionality. ASIC and/or SoCs with eFPGAs increase flexibility by facilitating combination of circuit/logic elements that that can be updated (e.g., associated with the eFPGA) with other elements of the ASIC/SoC.

As shown in FIG. 1A, a standalone Integrated Circuit (IC) chip 100 may include an FPGA core 102A. FPGA core 102A may be coupled to General Purpose Input/Output (GPIO) blocks 104 (shown as 104A, 104B, and 104C in FIG. 1A) and to one or more specific or dedicated interface blocks 106 (e.g., PCI Express, Ethernet, etc.). A standalone FPGA in the form of IC 100 may include various other blocks and/or logic/circuit elements (not shown in FIG. 1A) and may be coupled to other components on a circuit board using pins on IC 100.

FIG. 1B shows another example IC 110, which may include eFPGA 102B. IC 110 may be an ASIC or SoC and may include one or more processors (and/or processor cores) 120, hardwired register-transfer level (RTL) blocks, memory 130, Digital Signal Processor (DSP)/Engines block 140, and peripheral interface(s) 135. The blocks shown in FIG. 1B may be coupled using bus 150. For example, processor 120 and DSP/Engines block 140 may implement various application specific functions and additional customizations may be added using eFPGA 102B. In some embodiments, eFPGA 102 may be used to customize and/or accelerate machine learning applications, encryption schemes, etc., which may be implemented by Processor 120 and/or DSP/Engines block 140. As another example, eFPGA 102B may be used to implement and update functions or algorithms in the field (e.g., on deployed systems), or to address different markets (e.g., where each market may have one or more distinct requirements) using the same device (e.g., IC 110). Advantageously, integrated circuit 110, which incorporates eFPGA 102B, may provide a user with the functionality, case-of-use, and high performance found in a dedicated device, such as an ASIC, as well as the configurability and flexibility found in programmable logic.

Figure 2A:
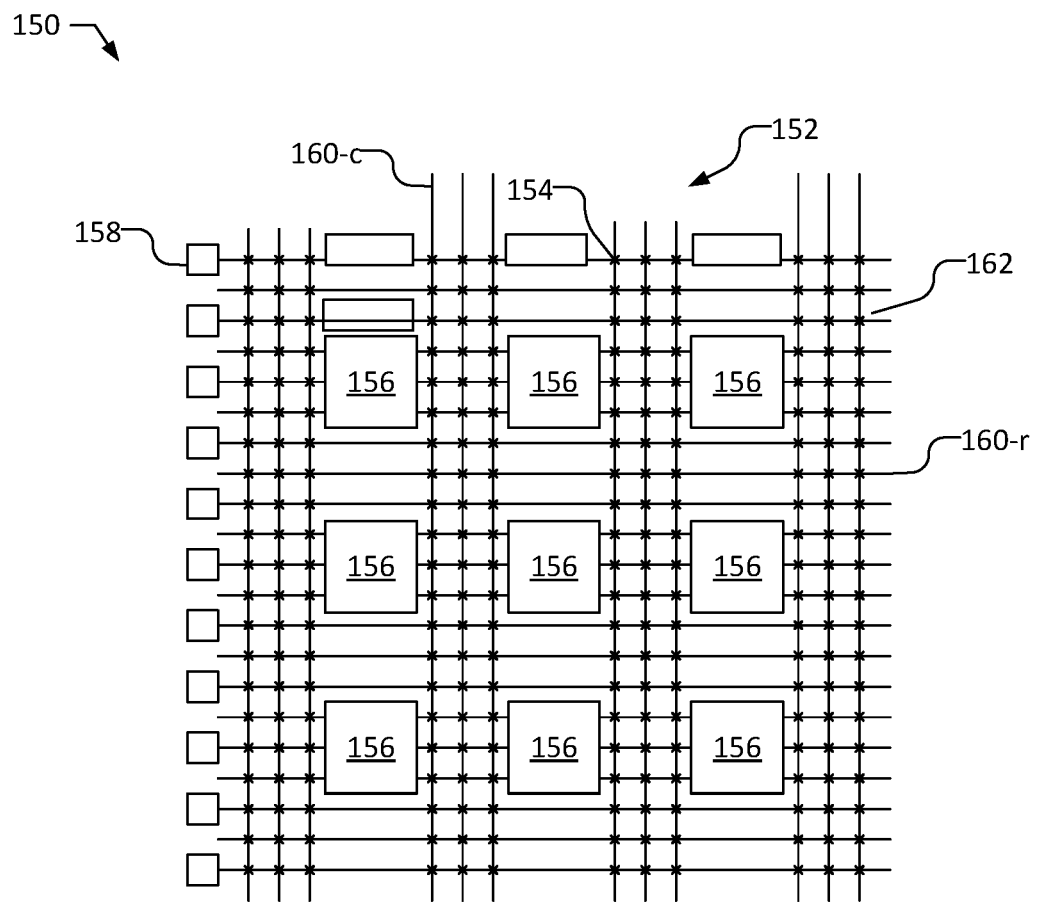
FIGS. 2A and 2B illustrate simplified schematics of a PLD in the form of an FPGA device such as the devices shown in FIGS. 1A and 1B.
Figure 2B:
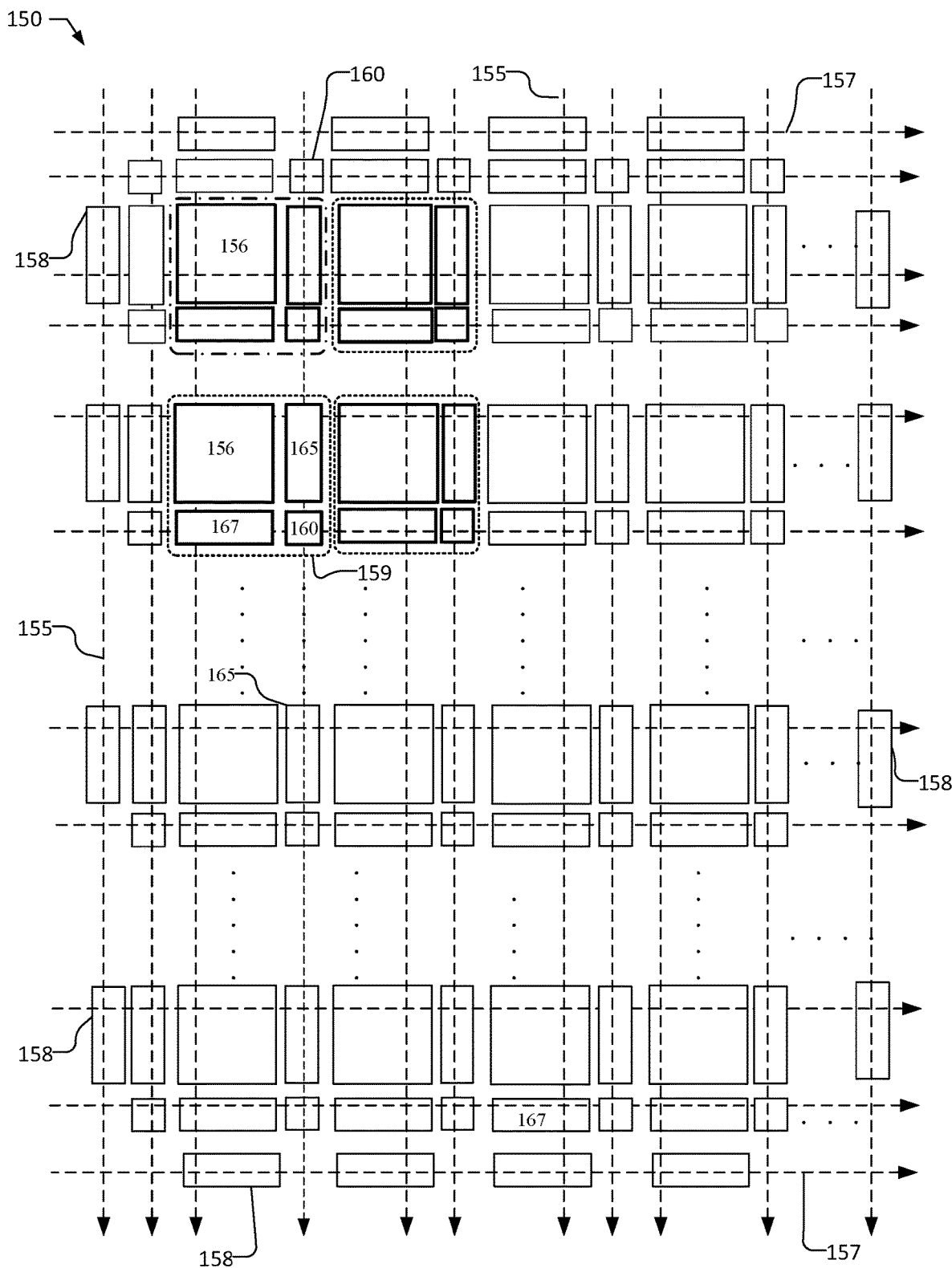

FIGS. 2A and 2B illustrate a simplified schematic of a PLD 150 in the form of an FPGA device (such as device 102A or 102B of FIG. 1A or 1B). FPGA device 150 may include an array 152 of programmable elements and conductors 160. In some instances, SRAM, antifuses, registers, or D-Latches 162, (shown marked by "x" in FIG. 2A), may be used to selectively connect conductors (e.g., horizontal conductors 160-r) with other conductors (e.g., vertical conductors 160-c). In FIGS. 2A and 2B the terms "vertical" and "horizontal" and/or "rows" and "columns" are merely used herein to facilitate identification of described elements in reference to the figures.

The array 152 of programmable elements (FIG. 2A), which is sometimes referred to as a programmable fabric, or programmable routing fabric is connected to a number of configurable logic blocks (CLBs) 156. Each CLB 156 may include a number of look up tables (LUTs) and/or logic elements, which can be selectively combined to perform a desired function through the appropriate interconnection of conductors (e.g., by using D-latches 162). In some embodiments, the LUTs in CLBs 156 may be implemented using latches (such as configuration memory latch 300 shown in FIG. 3A). Each LUT may be viewed as emulating some combinational function so that when using the inputs of the combinational function as LUT address bits, the memory bit storing the value of the function for each particular input combination may be read at the output of the LUT. As one example, the output of the LUT may be coupled to a latch. A mux may select the latch output (sequential logic) or LUT output (combinational logic) as the output of CLB 156. The output of CLB 156 may be connected to programmable routing fabric 152.

Input/output (I/O) circuits 158 provide an interface to external circuitry, i.e., off-chip circuitry and may facilitate access to internal resources via pins.

FIG. 2B shows another simplified schematic of FPGA device 150 (such as 102A or 102B of FIG. 1A or 1B) illustrating some other FPGA device elements. In some embodiments, depending on the size of FPGA 150, each CLB 156 may include and/or be associated with a plurality of configuration memories (e.g., hundreds or thousands of configuration memories), which are distributed over a large silicon area. Thus, a reasonable sized FPGA 150 may include millions of configuration memory bits. The configuration memories may be accessed using BLs 155 and WLs 157. Typically, BLs 155 and WLs 157 are made of a metal wire with the driver located in the FPGA array and/or along the perimeter.

Programmable routing resource 152 may include a routing resources CBX 167 in the horizontal direction and CBY 165 in the vertical direction. Programmable routing resource 152 may facilitate the configuration of programmable switches and wiring segments, which determines interconnection between CLBs. Switch block (SB) 160 provides interconnections between the horizontal and vertical wire segments.

A CLB 156 and the associated CBX 167, CBY 165, and SB 160 (which are shown enhanced in FIG. 2B) are also referred to as a tile or logic tile 159 (shown within dashed blocks in FIG. 2B). As outlined above, Input/Output (I/O) circuits 158 (also referred to as General Purpose Input Output (GPIO) 158) may provide an interface to external off-chip circuitry and facilitate access to internal resources via pins.

Figure 3A:
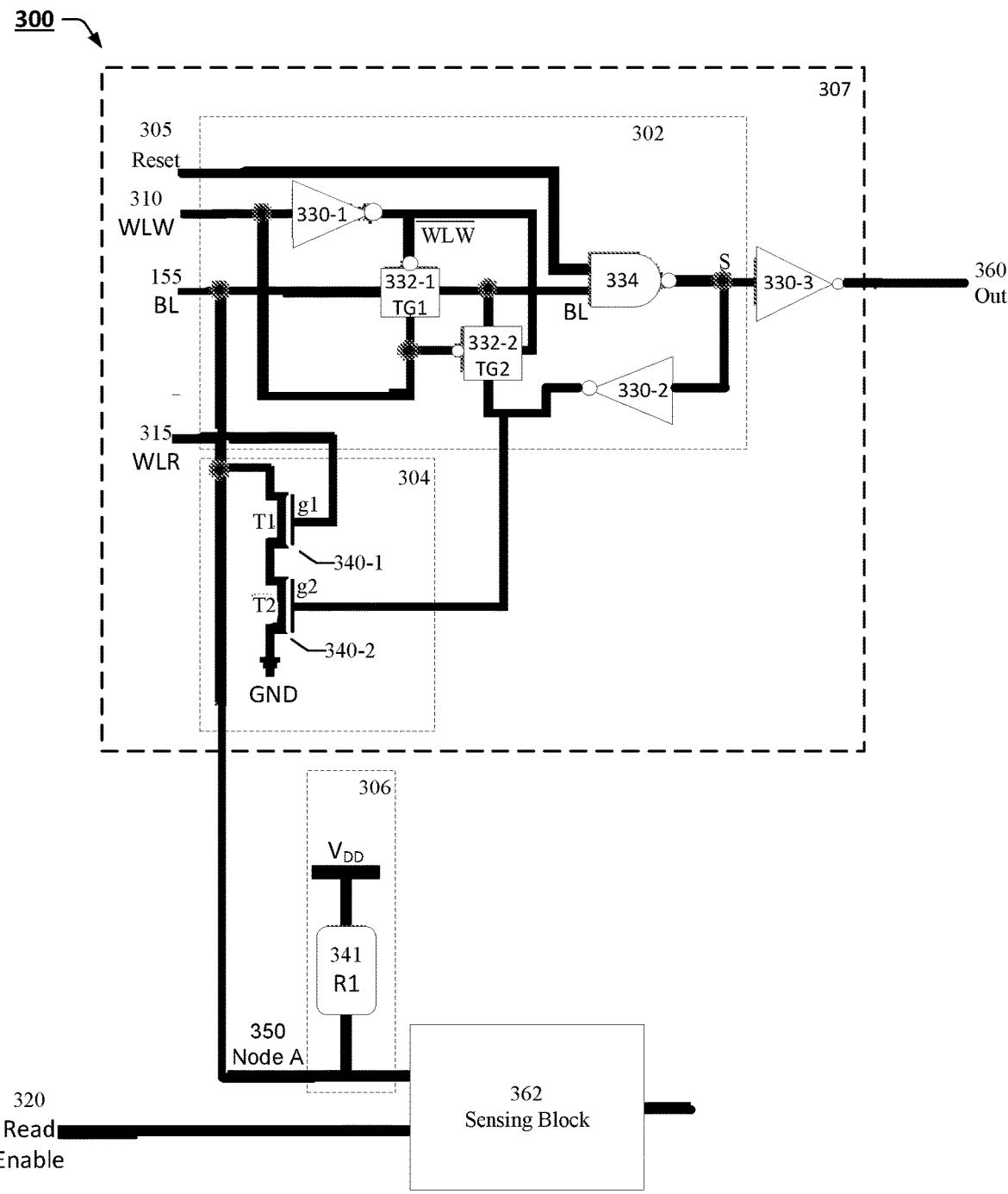
FIG. 3A shows a schematic of circuitry associated with a readable and resettable configuration latch with a non-terminated input.

FIG. 3A shows a schematic associated with readable and resettable configuration latch 300 with a non-terminated input. Configuration latch 300 is also referred to herein as configuration memory latch 300. In FIG. 3A, the outer dashed block 307 shows circuit elements that are repeated for each readable and resettable configuration memory latch (e.g., in one or more configuration memories), whereas circuit elements outside block 307 may be common to a plurality of configuration memory latches (in one or more configuration memories). For example, the circuitry in block 307 may be repeated for each configuration latch in a configuration memory and there may a plurality of configuration memories coupled to BL 155. Further, as shown in FIG. 3A, a single pull-up 306 and a single sensing block 362 may be coupled to a BL 155. Thus, a single pull up 306 and a single sensing block 362 may be coupled to plurality of blocks 307. Therefore, it is understood, when referring to configuration latch 300, that a single pull up 306 and a single sensing block 362 coupled to a BL 155-*i* may serve as a pull-up and a sensing block, respectively, for a plurality of blocks 307 (in one or more configuration memories) that are coupled to the same BL 155-*i*.

In some embodiments, configuration memory latch 300 may form part of a programmable logic device, or a field programmable gate array (FPGA). A latch may be used to store data. In PLDs such as FPGAs, readability of stored latch data is desirable while also maintaining data integrity in the latches. The term non-terminated input refers to a latch input that is not coupled to a high impedance node (e.g., unbuffered latch input). In some embodiments, configuration memory latch circuit 300 may be part of a configuration memory associated with a CLB 156 in FPGA 150. The configuration memory may include several configuration memory latch circuits 300. Configuration memory latch 300 shown in FIG. 3A may be used a with non-terminated (e.g., unbuffered) BL 155, which can improve area efficiency. Because an FPGA may include several million configuration memories, latch based configuration memory (such as configuration memory latch 300) can be more area efficient. Latch based configuration memory is also less susceptible to leakage when compared to register based configuration memory due to lower transistor counts. Further, SRAM type configuration memory is also more complex, whereas latch based configuration memories are typically available in standard cell libraries, thereby lowering development risk.

Non terminated input BL 155, may hold input data for write operations, with writes enabled by asserting WLW 310. Inverter 330-1 inverts WLW signal 315. BL 155 may also be used to sense data read from configuration latch 300, with reads enabled by asserting WLR 315. In FIG. 3A, in configuration latch 300, signals WLR 315 and WLW 310 are not both in an asserted state at any point in time. BL 155 is driving when WLW 310 is asserted and BL 155 is receiving when WLR 315 is asserted.

In the circuit of FIG. 3A, during write operations latched data reflects the state of BL 155. Accordingly (with WLW 310 asserted), when BL 155 is high, then a "1" is written, and when BL 155 is "0", then a "0" is written. However, during read operations, the state of BL 155 is the inverse of the latched data. Accordingly (with WLR 310 asserted), when the previously (stored) latched data is "0", BL 155 is high; and when the previously (stored) latched data is "1", BL 155 is low. Sensing block 362 may be configured to correctly read the latched data for a configuration memory bit based on the state of BL 155.

In some embodiments, configuration latch 300 may include a D-Latch 302, coupled to: (a) pull-down network 304, which, when activated, facilitates sensing "0" (on BL 155) by sensing block 362 during read operations, and (b) weak pull-up, which (when pull-down down network 304 is inactive) facilitates sensing "1" (on BL 155) by sensing block 362 during read operations. Data is written to latch 302 using input non-terminated BL 155 with WLW 310 asserted. Sensing block 362 senses data on BL 155 when WLR 315 and read enable 320 are both asserted. For example, sensing block 362 may comprise circuitry to sense the state ("1" or "0") of BL 155 during read operations when Read Enable signal 320 is asserted. As outlined previously, the state of BL 155 during read operations is indicative of the stored latched data being read.

Reading of latched data is facilitated by sensing block 362 based on the state (high or low) of BL 155 when WLR 315 and Read Enable 320 are both asserted. In some embodiments, sensing block 362 may be configured to output a 0 for a configuration memory bit when BL 155 is high, and output a 1 for the configuration memory bit when BL 155 is low. Writing of latch data is performed by asserting WLW 310 and holding BL 155 high, whereas writing 0 is performed by asserting WLW 310 and holding BL 155 low. During reads and in hold states, configuration memory latch 300 maintains stored data values thereby ensuring data integrity.

In FIG. 3A, reset line 305 is active low so that in normal operation reset line is held high (1). To reset configuration latch 300, reset line 305 is pulled low (0), which results in output of NAND gate 334 being 1. The output of NAND gate 334 is inverted by inverter 330-3 so that output 360 is 0, thus resetting configuration latch 300.

As shown in FIG. 3A, in configuration latch 300, the BL 155 input to transmission gate TG1 332-1 is not terminated, which eliminates input buffering and lowers latch transistor count. In FIG. 3A, BL 155 is an in-out (bi-directional) signal, where BL 155 is driving when WLW 310 is active ("1"), and BL 155 is receiving when WLR 315 is active ("1"). In FIG. 3A, WLW 310 and WLR 315 cannot both be active simultaneously.

In some embodiments, the output of D-latch 302 at Node S may be inverted by one or more inverters such as inverter 330-3 (shown in FIG. 3A), and used to drive output 360. In embodiments (such as FIG. 3A) that use single inverter 330-3, adequate driving capability may be ensured (e.g., to avoid crosstalk). In some embodiments, additional drivers may be used depending on the operating environment and other parameters such as size constraints.

When WLW 310 is active, TG1 332-1 is "On" and TG2 332-2 is in a high impedance state so that BL input 155 is written. During write operations (with WLW 310 active), timing issues can be managed with data stability on BL 155 being maintained over a time period beginning prior to assertion of WLW 310 and ending after the de-assertion of WLW 310.

Figure 3B:
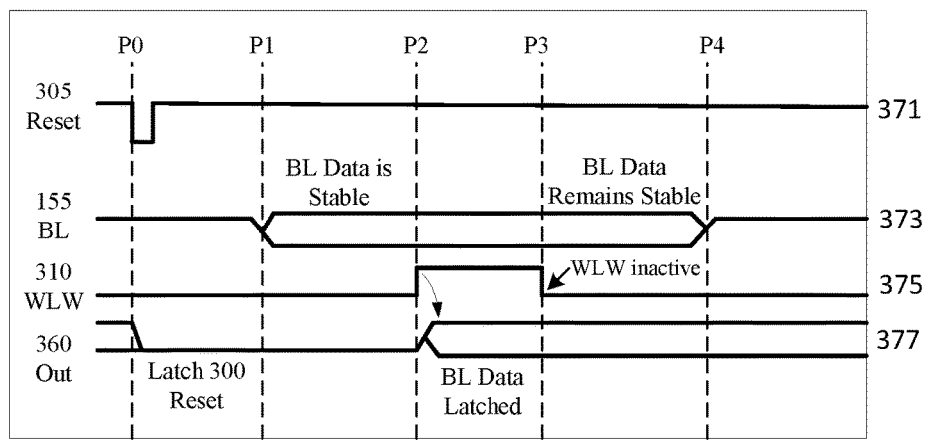
FIG. 3B shows timing diagram illustrating signal transitions during a write operation performed using the configuration memory latch of FIG. 3A.

FIG. 3B shows timing diagram 370 illustrating signal transitions during a write operation performed using configuration memory latch 300. In FIG. 3B, at time P0, reset signal 305 is activated (pulled low), as shown in waveform 371 for reset signal 305, which causes output signal 360 to transition to "0" in the period between P0 and P1, as shown in waveform 377 for output signal 360. When reset line 305 is pulled low (0), the output of NAND gate 334 (FIG. 3A) is 1. The output of NAND gate 334 is inverted by inverter 330-3 so that output 360 is 0 as shown in waveform 377 (FIG. 3C).

Referring to FIG. 3B, at time P1, subsequent to reset, data is placed on BL 155 as shown in waveform 373. At time P2, WLW signal 310 is activated and remains active until time P3 (as shown in waveform 375 for WLW 310). Data stability on BL 155 is ensured for the duration from P1 (prior to the activation of WLW 310) until time P4 (as shown in waveform 373). BL data remains stable until after WLW 310 is inactivated at time P3. As shown in waveform 377, after time P2 (when WLW signal 310 is activated and with stable data on BL 155), data on BL 155 is latched. Thus, with BL data stability over a time period beginning prior to assertion of WLW 310 and ending after the de-assertion of WLW 310, the write operation succeeds. Thus, configuration memory latch 300 provides write functionality with data integrity despite non-termination (e.g., no buffering) of input BL 155.

Figure 3C:
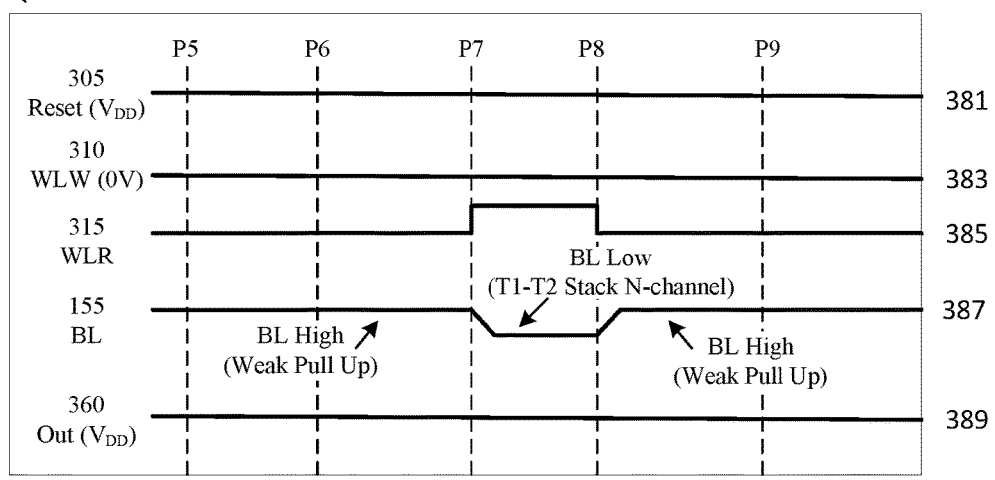
FIG. 3C shows timing diagram illustrating signal transitions during a read operation of a configuration bit in the configuration memory latch of FIG. 3A, when the latch data to be read is "1".

FIG. 3C shows timing diagram 380 illustrating signal transitions during a read operation (e.g., sensed by sensing block 362 with read enable 320 asserted) of a configuration bit in configuration memory latch 300, where the latch data to be read is "1". When reading, bus-keeping effected by weak pull-up R1 341, and/or precharge operations by programming logic circuitry may be used to condition BL 155 prior to reading (e.g., latch data of "1").

In FIG. 3C, reset line 305 is inactive (at VDD) for the duration of the operation (as shown by waveform 381). For example, latch 300 may have been previously reset followed by data being written to latch 300 (e.g., as illustrated in FIG. 3B). Further, because the operation is a read operation, WLW signal 310 is inactive for the duration of the operation (e.g., from P5 through P9) as shown in waveform 383. As outlined previously, WLW 310 is not asserted when WLR 315 is in an asserted state and vice versa.

As shown in FIG. 3C, from time P5 to P7 (and prior to the assertion of WLR signal 315), BL signal 155 stays high (as shown by waveform 387) because of the effect of weak pull up R1 341 (FIG. 3A). In some embodiments, weak pull up R1 341 (FIG. 3A) is placed on BL 155 furthest away from the detection circuits and serves to pull up BL 155 prior to the assertion of WLR signal 315. In some embodiments, weak pull up R1 341 may be placed further away from the detection circuit to minimize the voltage drop across the metal wire (associated with BL 155) between the detection circuit (e.g., sensing block 362) and the D-latch 302. The voltage drop is caused by the current path from weak pull up R1 341 to nMOS transistor T2 340-2 of the read (pull-down) network.

Further, as shown in FIG. 3C, at time P7, WLR signal 315 is asserted and remains asserted until time P8 (e.g., as shown in waveform 385). Accordingly, at time P7, when reading a "1", WLR 315 is active, WLW 310 is inactive, and the gate g2 of nMOS transistor T2 340-2 (FIG. 3A) will be at "1" (g2=1). Therefore, in pull down network comprising of the nMOS transistor stack T1 340-1 and T2 340-2, T1 340-1 is on (WLR=1), and T2 340-2 is on (g2=1). Accordingly, BL 155 is pulled to 0 starting at time P7 (as shown in waveform 387 in FIG. 3C) until time P8. As outlined previously, when BL 155 is pulled low, sensing block 362 (FIG. 3A) may detect or be configured to output a "1" (representing the latched data) corresponding to the stored configuration memory bit. Data is read during the assertion of WLR 315 (and Read Enable 320) from time P7 to P8.

At time P8, WLR 315 is de-asserted so that gate g1 of nMOS transistor T1 340-1 is 0, and T1 304-1 is turned off. Accordingly, weak pull up R1 341 (FIG. 3A) operates to pull up BL 155 at time P8 (as shown in waveform 387 in FIG. 3C) subsequent to the de-assertion of WLR 315. In FIG. 3C, the output signal 360 stays at 1 (VDD) throughout as indicated by waveform 389.

Figure 3D:
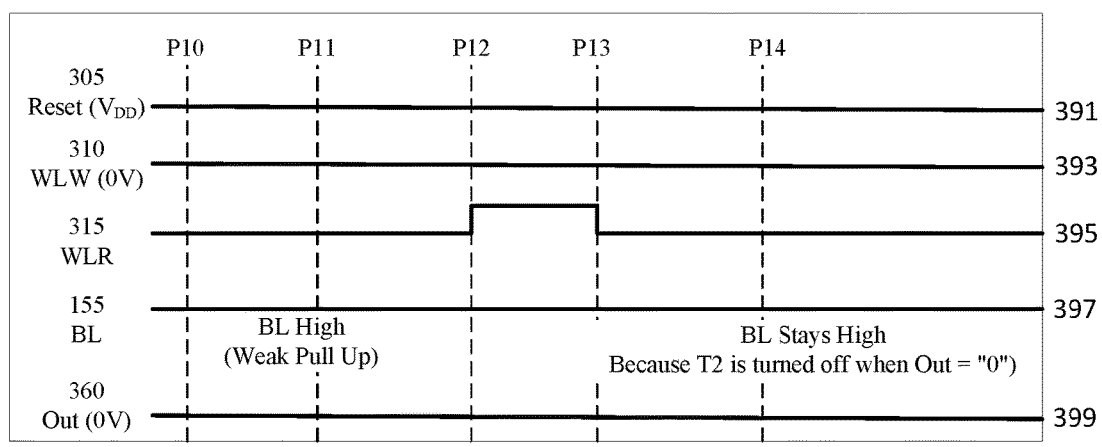
FIG. 3D shows timing diagram illustrating signal transitions during a read operation of a configuration bit in the configuration memory latch of FIG. 3A, when the stored latch data that is to be read is "0".

FIG. 3D shows timing diagram 390 illustrating signal transitions during a read operation (e.g., sensed by sensing block 362 with read enable 320 asserted) of a configuration bit in configuration memory latch 300, where the stored latch data that is to be read is "0". In FIG. 3D, reset line 305 is inactive (at VDD) from P10 through P14 (as shown by waveform 391). For example, latch 300 may have been previously reset followed by data (e.g., "0") being written to latch 300 (e.g., as illustrated in FIG. 3B). Further, because the operation is a read operation, WLW signal 310 is also inactive for the duration (e.g., from P10 through P14) shown in waveform 393 (in FIG. 3D). Accordingly, previously latched data (e.g., during the write operation) "0" may be output. In FIG. 3D, output signal 360 stays low at 0V, as shown by waveform 399.

Further, in FIG. 3D, prior to time P12, during which time WLR 315 remains de-asserted (as shown in waveform 395), BL 155 stays high (as shown in waveform 397) because of the action of weak pull up R1 341. At time P12, WLR 310 is asserted (as shown in waveform 395). Therefore, with reference to FIG. 3A, upon assertion of WLR 315, transistor T1 340-1 is on (gate g1 of transistor T1 340-1 is "1"), and, gate g2 of nMOS transistor T2 340-2 is "0." Accordingly, transistor T2 340-2 is off and BL 155 is pulled to 1 by weak pull up R1 341. As outlined previously, when BL 155 is pulled to 1, sensing block 362 (FIG. 3A) may detect or be configured to output a "0" (representing the latched data) corresponding to the stored configuration memory bit. Data is read during the assertion of WLR 315 (and Read Enable 320) from time P12 to P13.

Accordingly, in some embodiments, configuration memory latch circuit 300, may be associated with: a word line write (WLW) signal 310 that is asserted to enable data to be written into the configuration memory latch; a word line read (WLR) signal 315 that is asserted to enable data to be read from the configuration memory latch; and a non-terminated inout bit line (BL) 155 that drives input of a first data to be written into the configuration memory latch 300 during write operations, and wherein a state of the BL 155, during read operations, is indicative of a second data stored in the configuration memory latch 300. The non-terminated BL 155 may be driving when WLW 310 is asserted and receiving when WLR is asserted. Assertion of the WLW 310 signal and assertion of the WLR 315 signal do not overlap in time so that if WLW 310 is asserted then WLR 315 is de-asserted and vice versa.

Accordingly, in some embodiments, configuration memory latch circuit 300, may comprise a D-latch 302, wherein the input of the D-latch 302 is coupled to the non-terminated BL 155, wherein the D-Latch 302 operates to store the first data when the WLW signal is asserted and wherein the D-Latch 302 operates to output the stored second data when the WLW signal is de-asserted. In some embodiments, the configuration memory circuit 300 further comprises a pull-down network 304, wherein the pull-down network 304 is coupled to the BL 155 and to the D-Latch 302. The pull-down network 304 is activated when the WLR signal 315 is asserted and the stored second data (stored in the configuration memory latch 300 and output by the D-latch 302) is logic level 1, and wherein the pull-down network 304 is inactive otherwise. When activated the pull-down network 304 operates to pull down the BL 155 to logic level zero. In some embodiments, the configuration memory circuit 300 further comprises a weak pull-up 306, wherein the weak pull-up 306 is coupled to the BL 155 and to a sensing block 362, wherein, the weak pull-up operates to pull up the BL 155, when the pull-down network 304 is inactive, and wherein the sensing block 362 is configured to sense the state of the BL 155 (that is indicative the second data stored in the configuration memory latch 300) when the WLR signal and the read enable signal are both asserted. Thus, in some embodiments, the weak pull up operates to pull the BL to a logic one level, when the WLW signal 310 and the WLR signal 315 are both de-asserted. In some embodiments, sensing block 362 may be configured to output a logic zero when the state of the BL 155 is logic one, and output a logic one, when the state of the BL 155 is logic zero.

In some embodiments, D-latch 302 may comprise, a first transmission gate (TG) 332-1 with input of the first TG 332-1 coupled to the non-terminated BL 155, wherein the first TG 332-1 is activated when the WLW signal 310 asserted and stores the first data; a second TG 332-2 coupled to the output of the first TG 332-1, wherein the second TG 332-2 is activated when the WLW signal 310 is de-asserted and outputs the second data; a NAND gate 334, wherein the input of the NAND gate 334 is coupled to the output of the first TG 332-1 and to a reset line 305; and a first inverter 330-2, wherein the input of the first inverter 330-2 is coupled to the output of the NAND gate 334 and the output of the first inverter 330-2 is coupled to the output of the second TG 332-2.

Accordingly, in the configuration memory latch circuit 300, asserting the reset line 305 operates to reset the output line 360 to logic zero. In some embodiments, the reset line 305 is held high during normal operation of the configuration latch circuit 300, and a reset sequence is initiated by driving the reset line 305 to a logical zero.

In some embodiments, in the configuration memory latch circuit 300, when performing the write operations, the WLW signal 310 is asserted after the first data on the BL 155 is stable. Further, when performing the write operations, the stability of the first data on the BL 155 may be maintained for a period subsequent to the de-assertion of the WLW signal. In some embodiments, in the configuration memory latch circuit 300, a precharge operation may be performed prior to initiating a read of the second data.

Further, in some embodiments, pull-down network 304 may comprise a first nMOS transistor T1 340-1 coupled in series to a second nMOS transistor T2 340-2, wherein the first nMOS transistor gate input (g1) is coupled to the WLR signal 315 and the second nMOS transistor gate input (g2) is coupled to the output of the second TG 332-2 and to the output of the first inverter 330-2, and wherein the first nMOS transistor drain is coupled to the non-terminated BL 155 and the second nMOS transistor source is grounded.

Some disclosed embodiments, also pertain to an integrated circuit (IC) comprising: a programmable logic device (PLD), wherein the PLD comprises at least one configuration memory, and wherein the at least one configuration memory comprises a plurality of configuration memory latches 300 (e.g., as shown in FIG. 3A).

In some embodiments, configuration memory latch circuit 300, enables use of an unbuffered and/or non-terminated input bit line (e.g., BL 155) in an FPGA. Because an FPGA may include over a million configuration latches in a large memory array, the area-efficiency of configuration latch 300 can result in a lower FPGA area and/or die size without a loss of functionality, and/or may facilitate incorporation of additional functionality in a given area. Further, configuration memory latch circuit 300 enables reading of latch contents without compromising data integrity.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A device, comprising:
   a configuration memory latch;
   a bit line (BL)
   a first transmission gate (TG);
   a second TG coupled to the first TG;
   a NAND gate coupled to the first TG;
   a first inverter coupled to the NAND gate and the second TG;
   a pull-down network coupled to the second TG and to the first inverter; and
   a pull-up terminal coupled between the pull-down network and a sensing block, the pull-up terminal pulling up the BL when the pull-down network is inactive.

2. The device of claim 1, wherein the sensing block is configured to sense a state of the BL when a word line read (WLR) signal and a read enable signal are both asserted.

3. The device of claim 1 wherein the pull-down network includes a first nMOS transistor coupled in series to a second nMOS transistor.

4. The device of claim 3 wherein a gate input of the first nMOS transistor is coupled to a word line read (WLR) signal and a gate input of the second nMOS transistor is coupled to the second TG and to the first inverter.

5. The device of claim 4 wherein the first nMOS transistor drain is coupled to the bit line and the second nMOS transistor source is grounded.

6. The device of claim 1, comprising:
 a second inverter coupled to the NAND gate; and
 an output line of the configuration memory latch is coupled to the second inverter.

7. A device, comprising:
 a configuration memory latch;
 a non-terminated bit line (BL);
 a first transmission gate (TG) coupled to the non-terminated BL;
 a NAND gate coupled to the first TG;
 a first inverter coupled to the NAND gate;
 a pull-down circuitry coupled to the first inverter and to the non-terminated BL; and
 a sensing circuitry coupled to a pull-up terminal on the non-terminated BL.

8. The device of claim 7, wherein the sensing circuitry is configured to sense the state of the BL when a world line read signal and a read enable signal are both asserted.

9. The device of claim 7, wherein the state of the BL, during a read operation, is indicative of a second data stored in the configuration memory latch.

10. The device of claim 7, comprising a second TG coupled to an output of the first TG, wherein the second TG is activated when a word line write signal is de-asserted.

11. The device of claim 10, wherein the first inverter is coupled to an output of the second TG.

12. The device of claim 10, wherein the pull-down circuitry comprises a first nMOS transistor coupled in series to a second nMOS transistor, wherein a gate input of the second nMOS transistor is coupled to an output of the second TG and to an output of the first inverter, and the second nMOS transistor source is grounded.

13. The device of claim 7, wherein the pull-down circuitry comprises a first nMOS transistor coupled in series to a second nMOS transistor, wherein the first nMOS transistor drain is coupled to the non-terminated BL and the second nMOS transistor source is grounded.

14. The device of claim 7, wherein the pull-up terminal is coupled between the pull-down circuitry and the sensing circuitry, the pull-up terminal pulling up the non-terminated BL when the pull-down circuitry is inactive.

15. The device of claim 7, comprising a second inverter coupled to an output of the NAND gate.

16. The device of claim 7, wherein the first TG is activated when a word line write signal is asserted.

17. The device of claim 7, wherein the non-terminated BL is configured to input a first data into the configuration memory latch during a write operation.

18. A device, comprising:
 a configuration memory latch;
 a non-terminated bit line (BL);
 a D-latch coupled to the non-terminated BL;
 a first inverter coupled to the D-latch;
 a pull-down circuitry coupled to the D-latch and to the non-terminated BL; and
 a sensing circuitry coupled to a pull-up resistor on the non-terminated BL.

19. The device of claim 18, wherein the D-latch comprises a first transmission gate (TG) coupled to the non-terminated BL and a NAND gate coupled to the first TG.

20. The device of claim 19, wherein the D-latch comprises a second inverter coupled between the NAND gate and the first inverter.

* * * * *